United States Patent
Shin

(10) Patent No.: US 10,594,352 B2
(45) Date of Patent: Mar. 17, 2020

(54) PROTECTIVE CASE FOR A MOBILE TERMINAL

(71) Applicant: Seung Min Shin, Jeju-si (KR)

(72) Inventor: Seung Min Shin, Jeju-si (KR)

(73) Assignee: Seung Min Shin, Jeju si (KR)

( * ) Notice: Subject to any disclaimer, the term of this patent is extended or adjusted under 35 U.S.C. 154(b) by 0 days.

(21) Appl. No.: 15/823,438

(22) Filed: Nov. 27, 2017

(65) Prior Publication Data
US 2019/0115945 A1    Apr. 18, 2019

(30) Foreign Application Priority Data
Oct. 16, 2017    (KR) .................. 10-2017-0134034

(51) Int. Cl.
*H04B 1/3888*    (2015.01)
*A45C 11/00*    (2006.01)
(Continued)

(52) U.S. Cl.
CPC .......... *H04B 1/3888* (2013.01); *A45C 11/00* (2013.01); *H02J 7/0031* (2013.01); *H02J 7/0044* (2013.01);
(Continued)

(58) Field of Classification Search
CPC .............. A45C 2011/002; A45C 11/00; H04B 2001/3861; H04B 1/3883; H04B 1/3888
(Continued)

(56) References Cited

U.S. PATENT DOCUMENTS

| 10,193,365 | B2 * | 1/2019 | Balmer | ................ H01M 2/20 |
| 2008/0197801 | A1 * | 8/2008 | Manor | ................ H02J 7/0054 320/103 |

(Continued)

FOREIGN PATENT DOCUMENTS

| KR | 10-1247570 | 9/2012 |
| KR | 10-2014-0122851 | 10/2014 |

(Continued)

OTHER PUBLICATIONS

Examined Patent Publication issued by KIPO, published in Jun. 15, 2018 and granting the corresponding South Korea registration No. 10-1868289, citing the reference prior arts including the above-identified US patent application, in connection with the present application.

*Primary Examiner* — Ajibola A Akinyemi

(57) ABSTRACT

The present disclosure provides a protective case for a mobile terminal, the protective case including: a mobile terminal case which has a box shape, and surrounds and protects a mobile terminal; an auxiliary battery case which is positioned outside a rear surface of the mobile terminal case, and defines a space for accommodating an auxiliary battery; a mobile terminal side contact terminal which is disposed on an inner surface of the mobile terminal case, and is in electrical contact with an external terminal of the mobile terminal; and an auxiliary battery side contact terminal which is disposed on an inner surface of the auxiliary battery case, and is in electrical contact with an external terminal of the auxiliary battery, in which electric power of the auxiliary battery is provided to the mobile terminal through a connecting cable that electrically connects the mobile terminal side contact terminal and the auxiliary battery side contact terminal.

11 Claims, 15 Drawing Sheets

(51) Int. Cl.
*H04B 1/3883* (2015.01)
*H05K 5/00* (2006.01)
*H02J 7/00* (2006.01)

(52) U.S. Cl.
CPC .......... *H02J 7/0045* (2013.01); *H02J 7/0054* (2013.01); *H04B 1/3883* (2013.01); *H05K 5/0086* (2013.01); *A45C 2011/002* (2013.01); *H02J 2007/0037* (2013.01); *H02J 2007/0039* (2013.01)

(58) Field of Classification Search
USPC ...................................................... 455/575.8
See application file for complete search history.

(56) References Cited

U.S. PATENT DOCUMENTS

| | | | |
|---|---|---|---|
| 2015/0229228 A1* | 8/2015 | Rakovsky | H02J 7/0054 363/13 |
| 2015/0346792 A1* | 12/2015 | Rathi | G05F 1/625 713/310 |
| 2016/0118861 A1 | 4/2016 | Gabriel et al. | |
| 2017/0214263 A1* | 7/2017 | Fathollahi | H02J 7/0044 |
| 2018/0062687 A1* | 3/2018 | Jeon | H04M 1/0202 |

FOREIGN PATENT DOCUMENTS

| KR | 10-1554605 | 11/2014 |
|---|---|---|
| KR | 20-2016-003706 | 10/2016 |

\* cited by examiner (a)

(b)

# PROTECTIVE CASE FOR A MOBILE TERMINAL

CROSS-REFERENCE TO RELATED APPLICATIONS

This application claims the priority of Korean Patent Application No. 10-2017-0134034 filed on Oct. 16, 2017, in the Korean Intellectual Property Office, the disclosure of which is incorporated herein by reference.

BACKGROUND

Field

The present disclosure relates to a protective case for a mobile terminal, and more particularly, to a protective case capable of accommodating an auxiliary battery to supply electric power to a main body of a mobile terminal without replacing a battery mounted in the main body of the mobile terminal.

Description of the Related Art

In general, mobile terminals such as mobile phones, personal digital assistants (PDAs), and handheld computers may be used regardless of time and place and may perform various functions such as communication functions, multimedia functions, and wireless Internet functions, such that the use of the mobile terminals gradually increases.

However, because the mobile terminal is operated by a battery, there is a problem in that functions of the mobile terminal cannot be appropriately utilized when the battery is discharged due to a limited capacity of the battery.

Typically, the battery, which is discharged during the use of the mobile terminal, is connected to and charged by an external charger, or detached and then replaced with a battery fully charged by using a separate charging device. However, in the case of a mobile terminal with a battery embedded therein, the battery cannot be detached and replaced without disassembling a main body of the mobile terminal, and as a result, there is no other way but to often connect a wired or wireless charger or a separate auxiliary battery with a terminal charging terminal and charge the battery in order to maintain and manage the charge amount of the battery.

To solve the problem, Korean Patent No. 10-1247570 discloses that an auxiliary battery is embedded in a protective case for a mobile terminal to extend operating time of the mobile phone. However, this invention has an effect of extending operating time of the mobile phone by embedding the auxiliary battery in the protective case in which the mobile phone may be mounted, but has a problem in that the protective case needs to be separated from the terminal to replace the battery.

In addition, Korean Patent No. 10-1554605 discloses that a plate for protecting a rear surface of a mobile terminal is provided, and an auxiliary battery and an electric power output terminal are disposed on an upper portion of an inner surface of the plate to/from which the mobile phone is attached and detached, thereby extending operating time of the mobile phone. However, this invention still has a problem in that a rear plate of a main body of the mobile terminal needs to be disassembled to replace a battery.

In addition, Korean Patent Application Laid-Open No. 10-2014-0122851 discloses that an accommodating unit is included to fix an auxiliary battery to a protective case that surrounds a rear surface and a side surface of a mobile terminal. However, this invention also has a problem in that the auxiliary battery needs to be accommodated in the accommodating unit of the protective case first before attaching and coupling the protective case to the mobile terminal, and the protective case needs to be detached from the mobile terminal first in order to replace the auxiliary battery.

DOCUMENTS OF RELATED ART

Patent Document (Patent Document 0001) KR 10-1247570 B1
(Patent Document 0002) KR 10-1554605 B1
(Patent Document 0003) KR 10-2014-0122851 A1

SUMMARY

The present disclosure has been made in an effort to provide a protective case capable of being mounted on a mobile terminal and supplying electric power to the mobile terminal by using an auxiliary battery accommodated in the protective case without separating the protective case from the mobile terminal even though a battery mounted in a main body of the mobile terminal is discharged.

To solve the aforementioned problem, the present disclosure provides a protective case for a mobile terminal, the protective case including: a mobile terminal case which has a box shape, and surrounds and protects a mobile terminal; an auxiliary battery case which is positioned outside a rear surface of the mobile terminal case, and defines a space for accommodating an auxiliary battery; a mobile terminal side contact terminal which is disposed on an inner surface of the mobile terminal case, and is in electrical contact with an external terminal of the mobile terminal; and an auxiliary battery side contact terminal which is disposed on an inner surface of the auxiliary battery case, and is in electrical contact with an external terminal of the auxiliary battery, in which electric power of the auxiliary battery is provided to the mobile terminal through a connecting cable that electrically connects the mobile terminal side contact terminal and the auxiliary battery side contact terminal.

According to the exemplary embodiment, the auxiliary battery side contact terminal may be at least one conductive pin which protrudes to come into direct contact with a terminal exposed to the outside of the auxiliary battery.

According to the exemplary embodiment, the mobile terminal case may further include a first connecting cable side contact terminal which is positioned on an outer surface of the mobile terminal case and comes into electrical contact with a mobile terminal side connector positioned at one tip portion of the connecting cable.

According to the exemplary embodiment, the auxiliary battery case may further include a second connecting cable side contact terminal which is positioned on an outer surface of the auxiliary battery case and comes into electrical contact with an auxiliary battery side connector positioned at the other tip portion of the connecting cable.

According to the exemplary embodiment, the connecting cable may further include a power relay module which disconnects the electrical connection between the auxiliary battery and the mobile terminal at the time of overcurrent in order to prevent overcurrent from being supplied to the mobile terminal.

According to the exemplary embodiment, the power relay module may include: a power detection unit which detects voltage of the mobile terminal; and a charging control unit which cuts off a supply of electric power from the auxiliary battery to the mobile terminal when a battery in the mobile terminal is fully charged based on the voltage detected by the power detection unit.

According to the exemplary embodiment, the charging control unit may cut off a supply of electric power from the auxiliary battery to the mobile terminal based on a result of comparing a predetermined charging reference value and a voltage value detected by the power detection unit, and the power relay module may perform data communication with the mobile terminal, such that the charging reference value is set or changed by an application executed in the mobile terminal.

According to the exemplary embodiment, the auxiliary battery case may include an upper frame, a lower frame, a left frame, and a right frame, the auxiliary battery side contact terminal may be disposed on an inner surface of one end portion of the lower frame such that a position of one end portion of the lower frame is fixed, and a size of an accommodation space of the auxiliary battery case may vary as the left frame slides in a left and right direction along first longitudinally extending guides formed at the other end portion of the lower frame and the other end portion of the upper frame corresponding to a position of the other end portion of the lower frame.

According to the exemplary embodiment, the auxiliary battery case may include an upper frame, a lower frame, a left frame, and a right frame, the auxiliary battery side contact terminal may be disposed on an inner surface of one end portion of the lower frame such that a position of one end portion of the lower frame is fixed, and a size of the accommodation space of the auxiliary battery case may vary as the upper frame slides in an up and down direction along second longitudinally extending guides formed at a first cut-out portion formed at one position of the left frame and a second cut-out portion formed at one position of the right frame.

According to the exemplary embodiment, the auxiliary battery case may be positioned to be biased in a direction toward one end portion of the mobile terminal case and may protrude outward from the rear surface of the mobile terminal case.

According to the exemplary embodiment, the auxiliary battery case may include a cover for covering a space for accommodating the auxiliary battery, and the cover may be hingedly coupled to one side of the auxiliary battery case, such that the cover, which is opened at a predetermined angle, mounts the tilted mobile terminal.

According to the exemplary embodiment, the auxiliary battery case may include a cover for covering a space for accommodating the auxiliary battery, and the cover may be provided as an accessory separated from the auxiliary battery case and may include at least one hook protruding from an surface of the cover that faces the auxiliary battery case, such that the cover is coupled to the auxiliary battery case.

The protective case according to the present disclosure may supply electric power to the mobile terminal by using the auxiliary battery accommodated in the protective case without separating the protective case from the mobile terminal even though the battery mounted in the main body of the mobile terminal is discharged.

In addition, a user may easily replace the auxiliary battery accommodated in the protective case without separating the protective case from the mobile terminal.

In addition, by using the power relay module included in the connecting cable, it is possible to protect the mobile terminal from overcurrent, prevent electric power of the auxiliary battery from being continuously supplied to the mobile terminal when the mobile terminal is fully charged, or allow a user to set or change a charging reference value by performing an input through a separate user input means or an application executed by the mobile terminal such that electric power of the auxiliary battery may be restrictively supplied to the mobile terminal based on the charging reference value.

In addition, since the size of the auxiliary battery case of the protective case is variable, it is possible to mount auxiliary batteries having various sizes in the protective case.

In addition, it is possible to mount the mobile terminal on a floor by using the auxiliary battery case of the protective case.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENT

Figure 1:
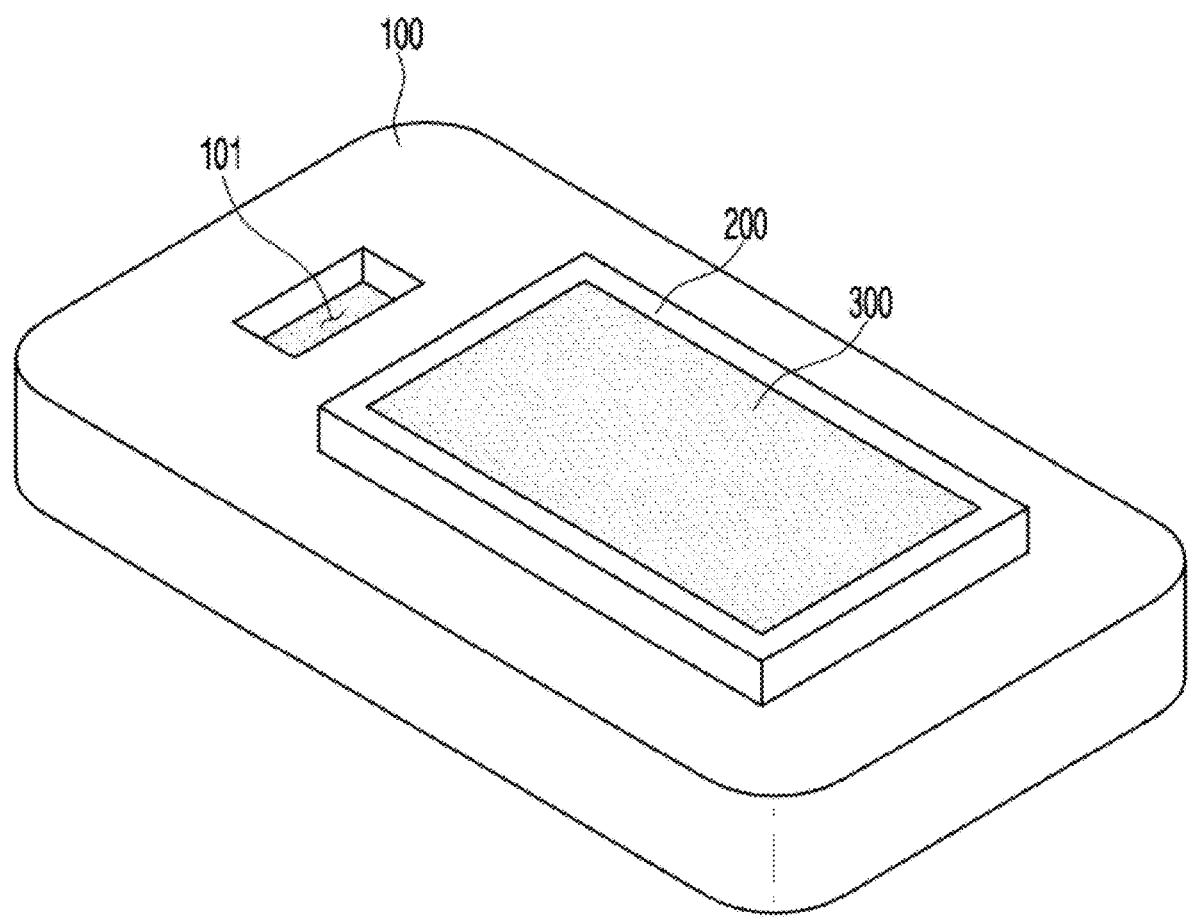
FIG. 1 is a view illustrating an overall external appearance of a protective case for a mobile terminal according to an exemplary embodiment of the present disclosure.

Hereinafter, exemplary embodiments of the present disclosure will be described in detail with reference to the accompanying drawings. In the description of the present disclosure, the specific descriptions of publicly known related technologies will be omitted when it is determined that the specific descriptions may obscure the subject matter of the present disclosure. A part irrelevant to the description will be omitted in the drawings in order to clearly describe the present disclosure, and similar constituent elements will be designated by similar reference numerals throughout the specification. Throughout the specification, unless explicitly described to the contrary, the word "comprise" and variations such as "comprises" or "comprising" will be understood to imply the inclusion of stated elements but not the exclusion of any other elements.

Figure 2:
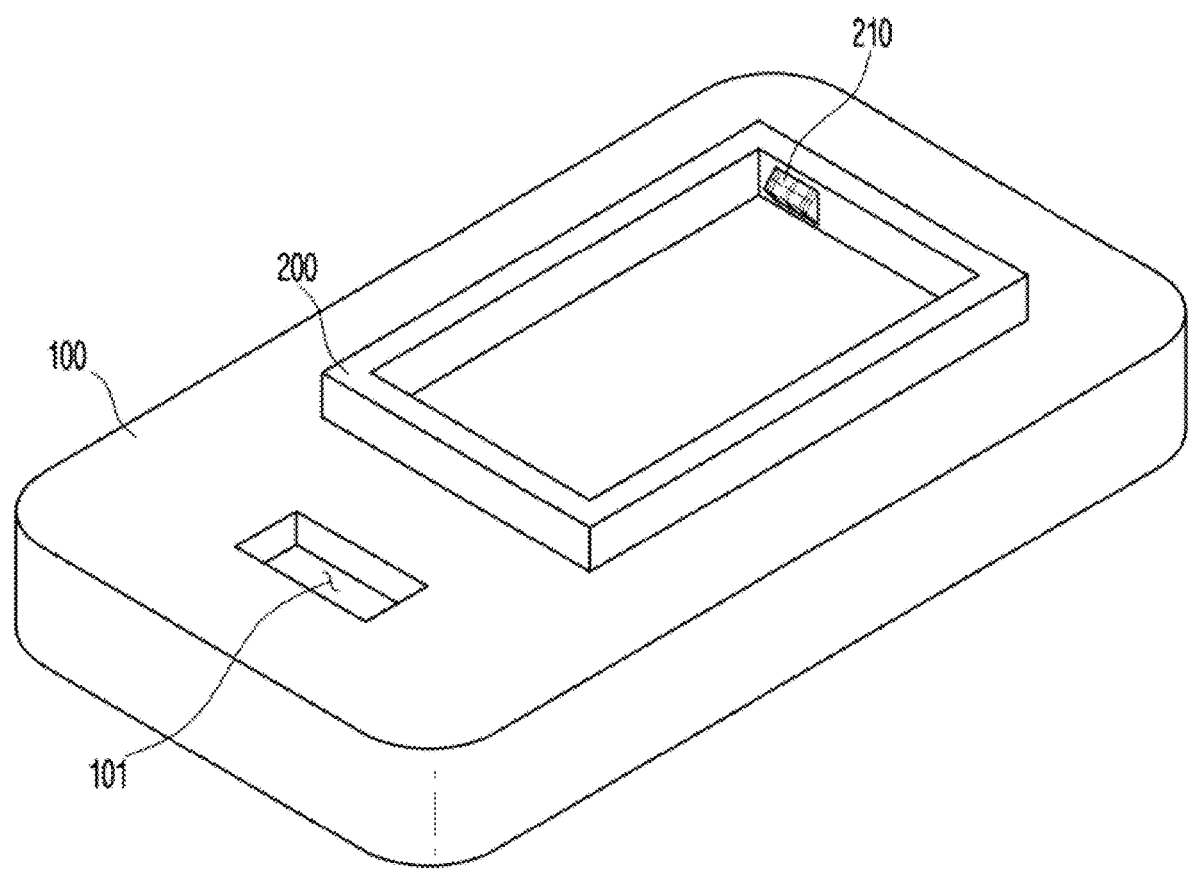
FIG. 2 is a rear perspective view of the protective case for a mobile terminal according to the exemplary embodiment of the present disclosure.

FIG. 1 is a view illustrating an overall external appearance of a protective case for a mobile terminal according to an exemplary embodiment of the present disclosure, and FIG. 2 is a rear perspective view of the protective case for a mobile terminal according to the exemplary embodiment of the present disclosure.

As illustrated in FIGS. 1 and 2, the protective case for a mobile terminal according to the exemplary embodiment of the present disclosure broadly includes a box-shaped mobile terminal case 100 which surrounds and protects a mobile terminal 400, and an auxiliary battery case 200 which is positioned outside a rear surface of the mobile terminal case 100 and defines a space for accommodating an auxiliary battery 300.

Therefore, the mobile terminal 400 may be mounted in the mobile terminal case 100 positioned at the front side, and the auxiliary battery 400 is mounted in the auxiliary battery case 200 positioned at the rear side so that at least a part of the auxiliary battery 400 is exposed, such that a user may attach and detach the auxiliary battery 300 without separating the protective case from the mobile terminal 400.

Figure 5:
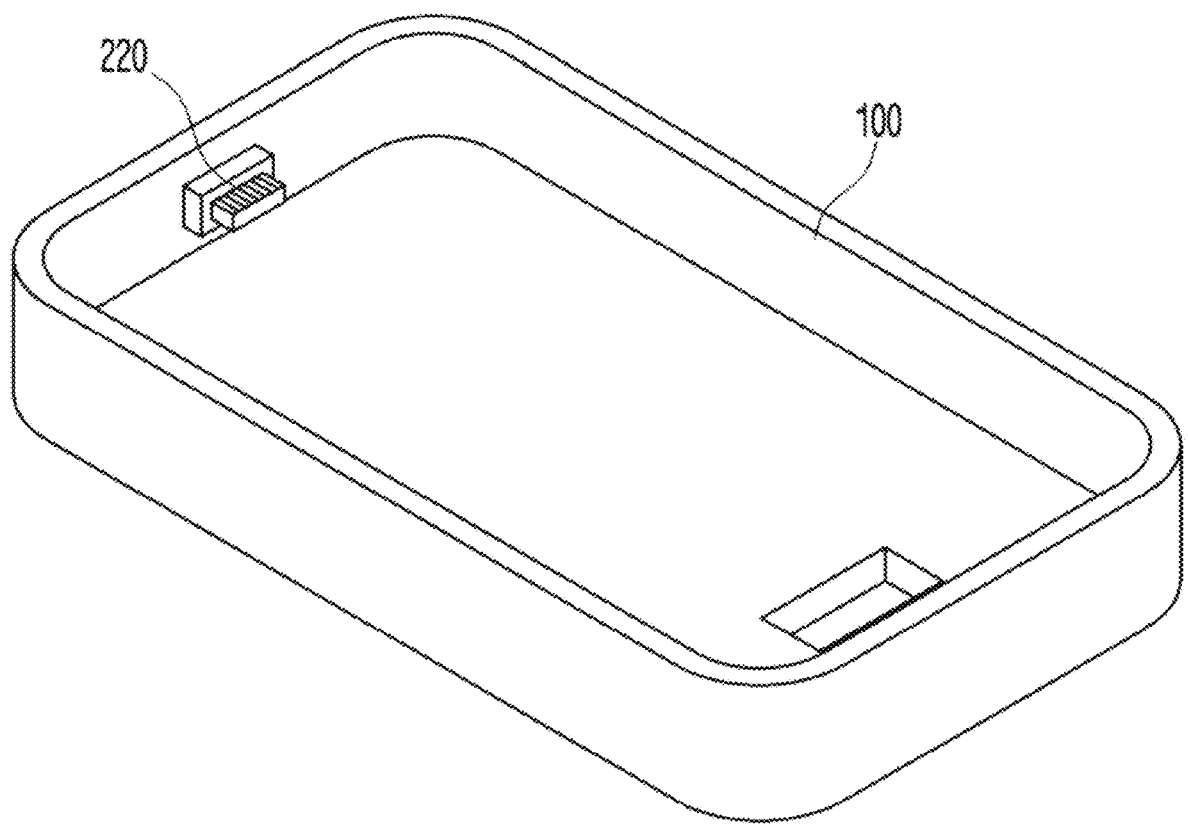
FIG. 5 is a front perspective view of the protective case for a mobile terminal according to the exemplary embodiment of the present disclosure.
Figure 6:
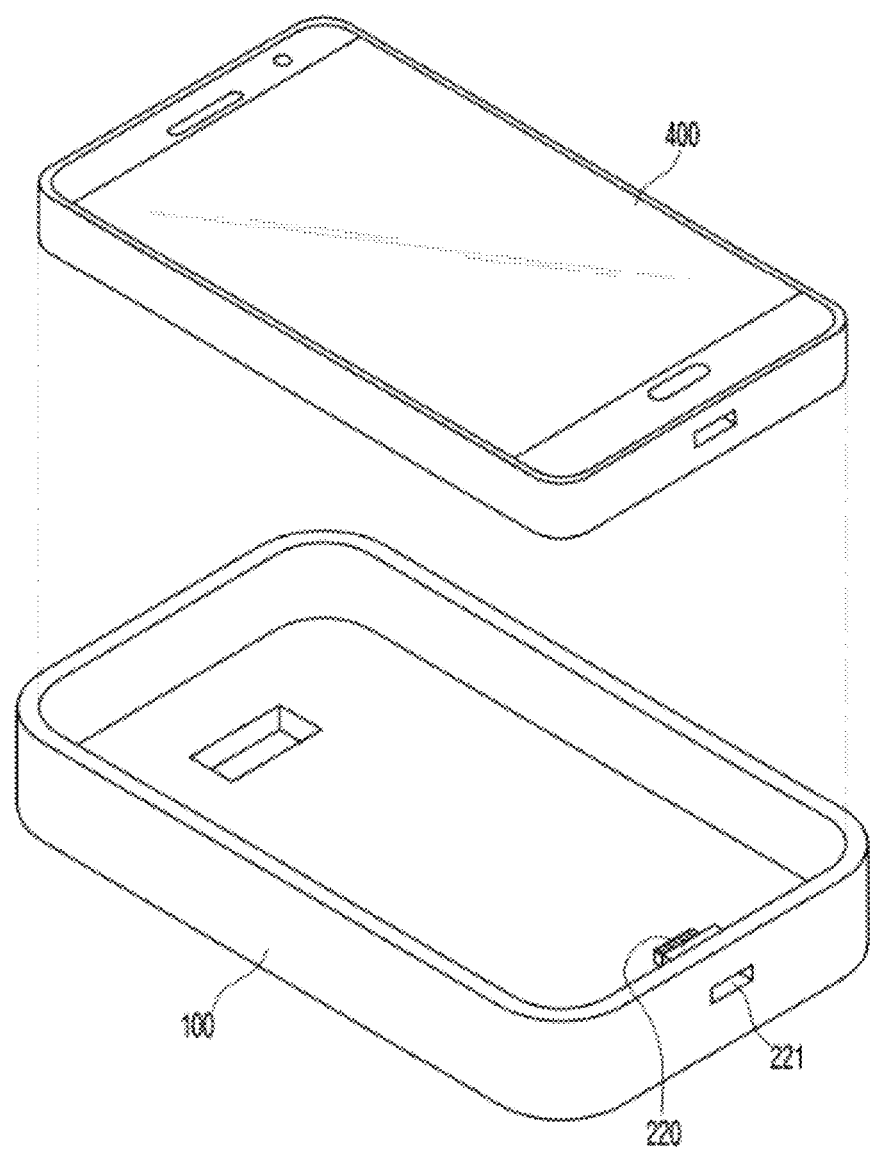
FIG. 6 is a view illustrating a state in which a mobile terminal is mounted in a mobile terminal case positioned on a front surface of the protective case for a mobile terminal illustrated in FIG. 5.
Figure 7:
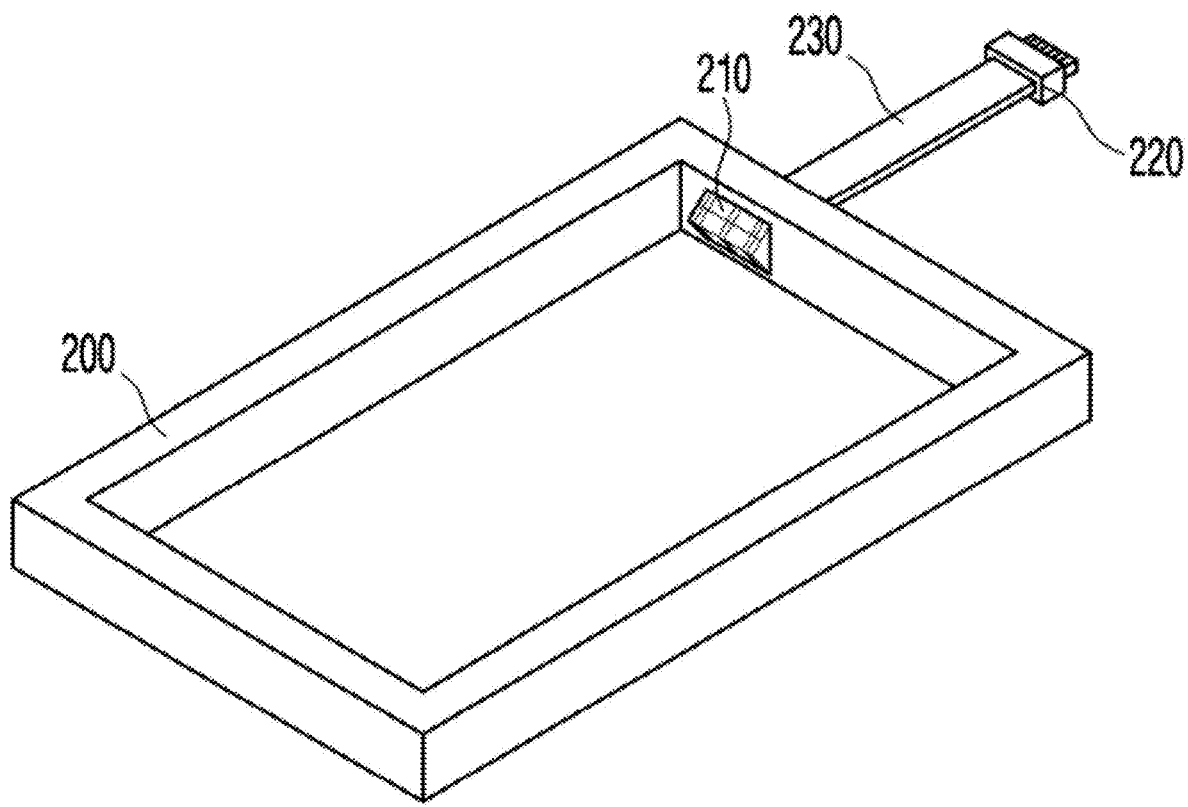
FIG. 7 is a view illustrating a state in which a connecting cable is connected to the auxiliary battery case according to the exemplary embodiment of the present disclosure.

The mobile terminal case 100 accommodates the mobile terminal 400 in an inner accommodation space thereof and surrounds the mobile terminal 400, thereby protecting the mobile terminal 400 from external impact or the like. As illustrated in FIGS. 5 and 6, a mobile terminal side contact terminal 220, which comes into electrical contact with an external terminal of the mobile terminal 400, may be disposed on an inner surface of the mobile terminal case 100.

The mobile terminal side contact terminal 220 may be positioned on the inner surface of the mobile terminal case 100, and may be positioned to correspond to a position of the external terminal of the mobile terminal 400 mounted in the mobile terminal case 100. The mobile terminal side contact terminal 220 may have a shape, the number of pins, arrangement, or the like that corresponds to that of a contact terminal of the external terminal of the mobile terminal 400.

In this case, because the mobile terminal case 100 and the mobile terminal 400 mounted in the mobile terminal case 100 are in close contact with each other, the mobile terminal case 100 may be made of plastic, metal, alloy, carbon fiber, wood, and the like in order to easily insert the mobile terminal side contact terminal 220 into the external terminal of the mobile terminal 400 and easily mount the mobile terminal 400 in the mobile terminal case 100, and particularly, at least a part of the mobile terminal case 100 may be made of a soft material such as silicone or rubber.

Here, the external terminal of the mobile terminal 400 refers to an element provided in the mobile terminal 400 to charge a battery by supplying electric power to a main body of the mobile terminal or to use various types of expanded devices (USB data communication, a remote controller, an ear set, composite video outputs, and the like).

The auxiliary battery case 200 serves to accommodate the auxiliary battery 300 in an inner accommodation space thereof. To prevent the auxiliary battery 300 mounted in the auxiliary battery case 200 from being easily withdrawn to the outside, the auxiliary battery case 200 may be in close contact with the auxiliary battery 300 to surround the auxiliary battery 300, or a part of an upper end portion of the auxiliary battery case 200 may be bent to cover a part of an upper surface of the auxiliary battery 300.

In this case, as illustrated in FIG. 2 and the like, an auxiliary battery side contact terminal 210, which comes into electrical contact with an external terminal of the auxiliary battery 300, may be disposed on an inner surface of the auxiliary battery case 200.

The auxiliary battery side contact terminal 210 may be positioned on the inner surface of the auxiliary battery case 200, and may be positioned to correspond to a position of the external terminal of the auxiliary battery 300 mounted in the auxiliary battery case 200. The auxiliary battery side contact terminal 210 may have a shape, the number of pins, arrangement, or the like that corresponds to that of the external terminal of the auxiliary battery 300.

In this case, similar to the mobile terminal case 100, the auxiliary battery case 200 may be made of plastic, metal, alloy, carbon fiber, wood, and the like, and particularly, at least a part of the auxiliary battery case 200 may be made of a soft material such as silicone or rubber, such that the auxiliary battery 300 may be mounted by being in close contact with the auxiliary battery case 200.

Unlike the mobile terminal case 100, the auxiliary battery case 200 may be made of a hard material because the auxiliary battery 300, which is to be mounted in the auxiliary battery case 200, is typically formed in a state in which the external terminal is exposed to the outside, and the auxiliary battery side contact terminal 210 may include at least one conductive pin that protrudes to come into direct contact with the external terminal exposed outward from the auxiliary battery 300.

In this case, the conductive pin may protrude toward the external terminal of the auxiliary battery 300, and more particularly, the conductive pin may protrude toward the external terminal of the auxiliary battery 300 and may have elastic force. As an example, the conductive pin may be, but not necessarily limited to, a terminal having a contact protrusion having a surface made of an electric conductive material, or a cylindrical spring pin such as a pogo pin.

As a result, the mobile terminal side contact terminal 220 and the auxiliary battery side contact terminal 210 are electrically connected to each other through a connecting cable 230, such that electric power of the auxiliary battery 300 may be supplied to the mobile terminal 400.

The connecting cable 230 serves to electrically connect the mobile terminal side contact terminal 220 and the auxiliary battery side contact terminal 210. As an exemplary embodiment, one tip portion and/or the other tip portion of the connecting cable 230 may be formed integrally with the mobile terminal side contact terminal 220 and/or the auxiliary battery side contact terminal 210. As another exemplary embodiment, a mobile terminal side connector (not illustrated) and/or an auxiliary battery side connector (not illustrated) may be provided at one tip portion and/or the other tip portion of the connecting cable 230, such that the connecting cable 230 may be attached to and detached from the mobile terminal side contact terminal 220 and/or the auxiliary battery side contact terminal 210.

As an exemplary embodiment, if the mobile terminal side connector (not illustrated) is provided at one tip portion of the connecting cable 230, a first connecting cable side contact terminal 221 (see FIG. 6) may be provided in an outer surface of the mobile terminal case 100 so that the mobile terminal side connector may be electrically connected to the mobile terminal side contact terminal 220, such that the mobile terminal side connector and the mobile terminal side contact terminal 220 may be electrically connected to each other through the first connecting cable side contact terminal 221.

Likewise, if the auxiliary battery side connector (not illustrated) is provided at the other tip portion of the connecting cable 230, a second connecting cable side contact terminal (not illustrated) may be provided in an outer surface of the auxiliary battery case 200 so that the auxiliary battery side connector may be electrically connected to the auxiliary battery side contact terminal 210, such that the auxiliary battery side connector and the auxiliary battery side contact terminal 210 may be electrically connected to each other through the second connecting cable side contact terminal.

Figure 8:
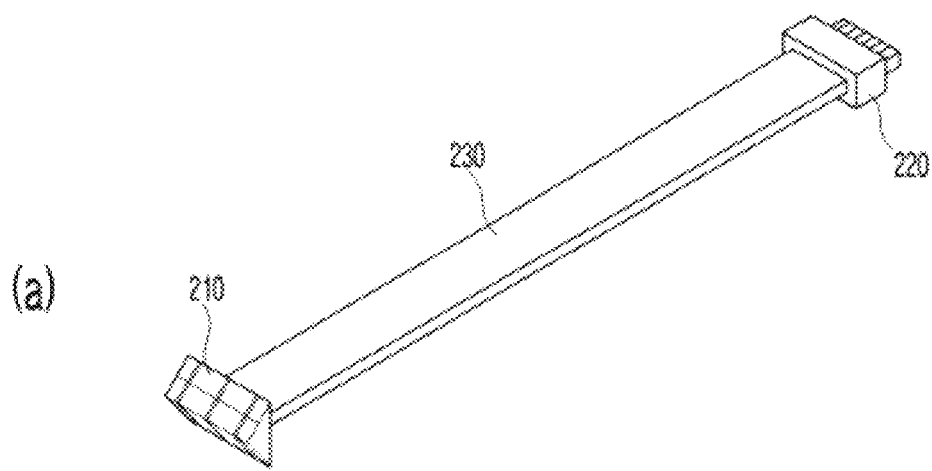
FIG. 8 is a view illustrating an overall external appearance of the connecting cable according to the exemplary embodiment of the present disclosure.
Figure 8:
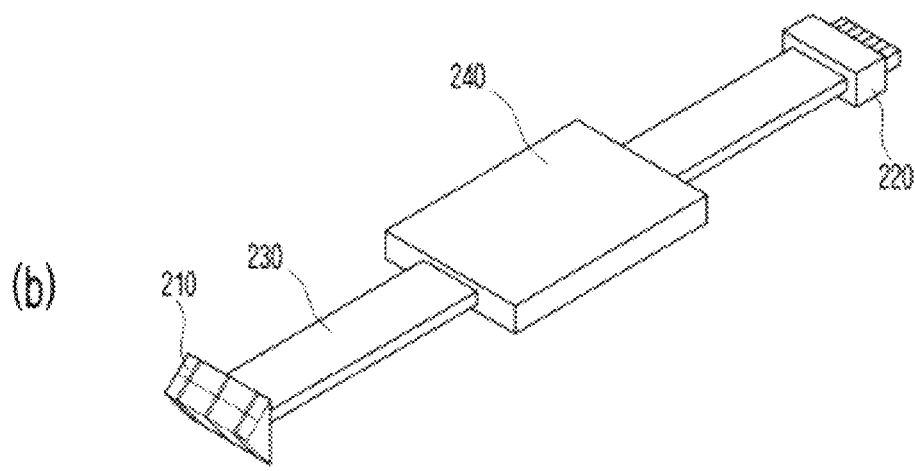
Figure 9:
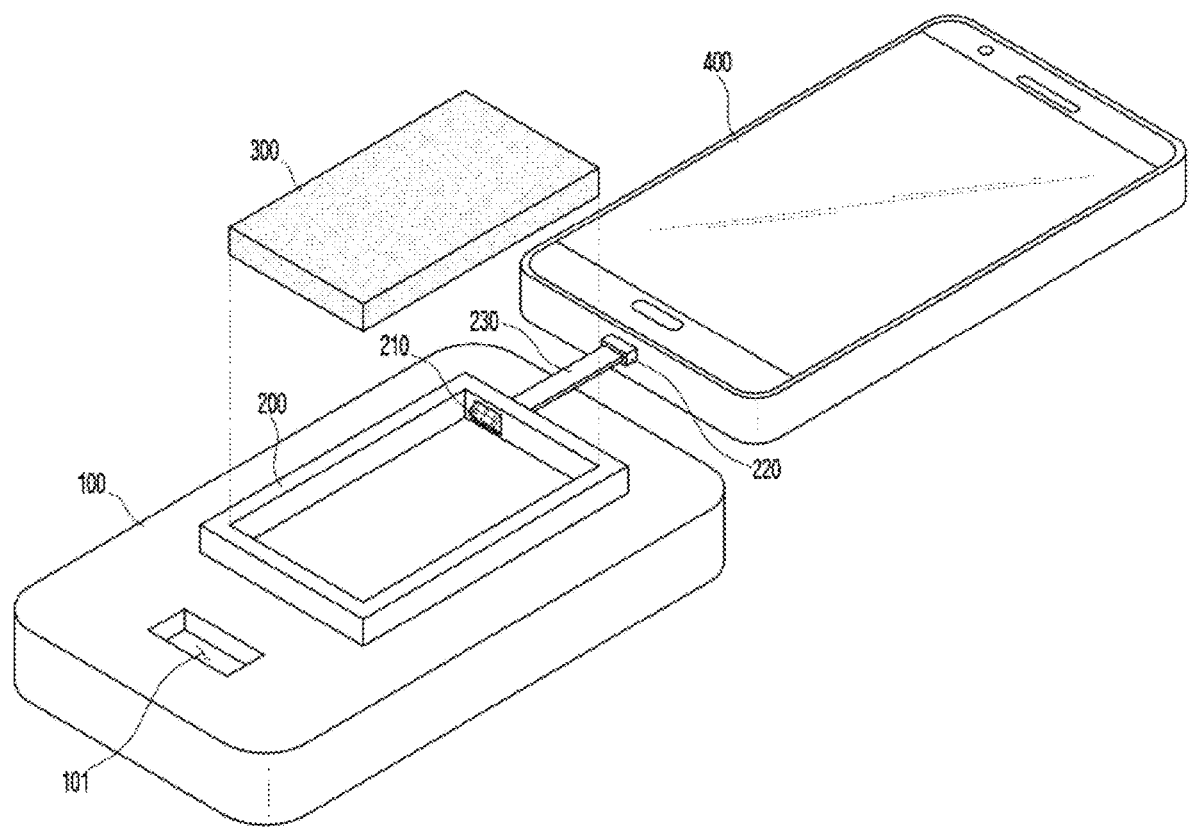
FIG. 9 is a view illustrating a state in which the auxiliary battery is mounted in the protective case according to the exemplary embodiment of the present disclosure and the auxiliary battery is connected to the mobile terminal through the connecting cable.
Figure 10:
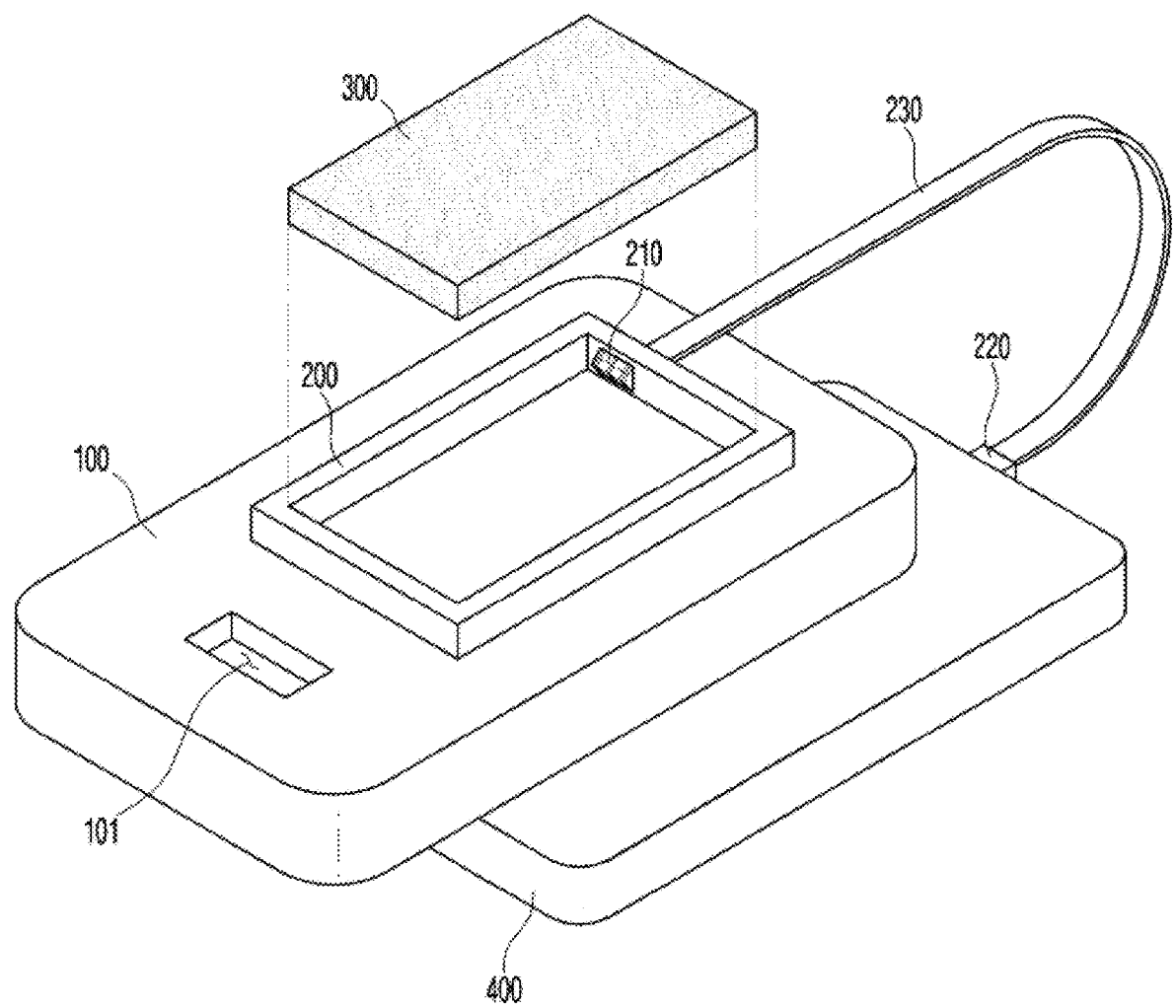
FIGS. 10 and 11 are views illustrating states in which connecting cables according to the exemplary embodiment of the present disclosure are applied to FIG. 9.

FIG. 8 is a view illustrating an overall external appearance of the connecting cable according to the exemplary embodiment of the present disclosure. As illustrated in FIG. 8A, as an exemplary embodiment, the connecting cable 230 may be a cable such as a typically used conductive line. As still another exemplary embodiment, the connecting cable 230 may include a power relay module 240.

If a circuit board for controlling voltage or electric current of electric power outputted from the auxiliary battery 300 is not included in accordance with an implemented form of the auxiliary battery 300, the power relay module 240 may include a voltage control circuit and/or a rectifier circuit in order to control and/or rectify voltage and/or electric current of electric power outputted from the auxiliary battery 300 in order to produce voltage and/or electric current suitable for rated voltage and/or electric current to be inputted to the mobile terminal 400.

As an exemplary embodiment, to prevent overcurrent outputted from the auxiliary battery 300 from being supplied to the mobile terminal 400 and causing damage to the mobile terminal 400, the power relay module 240 may include an element capable of disconnecting the electrical connection between the auxiliary battery 300 and the mobile terminal 400 at the time of overcurrent in order to prevent overcurrent from being supplied to the mobile terminal 400.

In addition, as an exemplary embodiment, the power relay module 240 may include a power detection unit (not illustrated) which detects voltage of the battery mounted in the main body of the mobile terminal 400, and a charging control unit (not illustrated) which disconnects the electrical connection between the auxiliary battery 300 and the mobile terminal 400 when the battery in the mobile terminal 400 is fully charged based on the voltage detected by the power detection unit.

The charging control unit compares a predetermined charging reference value and a voltage value detected by the power detection unit, and when the detected voltage value is equal to the charging reference value or included in a predetermined range, the charging control unit disconnects the electrical connection between the auxiliary battery 300 and the mobile terminal 400, thereby cutting off a supply of electric power to the mobile terminal 400.

As an exemplary embodiment, the charging reference value may be set or changed by an application which is stored in the mobile terminal 400 and executed. The power relay module 240 may perform data communication with the mobile terminal 400, and thus the charging reference value may be set or changed by the application executed by the mobile terminal 400. The power relay module 240 may further include wired and/or wireless communication modules for performing data communication with the mobile terminal 400. The wired communication module may be connected to the external terminal of the mobile terminal 400 through the connecting cable 230 so that the wired communication module may perform communication with the mobile terminal 400. The wireless communication module may be connected to the mobile terminal 400 through short or long distance wireless communication methods (for example, Bluetooth, Wi-Fi, NFC, and the like) so that the wireless communication module may perform communication with the mobile terminal 400.

As still another exemplary embodiment, the power relay module 240 may further include a user input means (not illustrated) such as a button or a dial for setting the charging reference value, and the charging reference value may be changed by an input through the user input means. In this case, an installation position of the user input means is not particularly limited, but as an example, the user input means may be installed on the power relay module 240 or one surface of the protective case 100 for a mobile terminal or the auxiliary battery case 200.

In addition, the power relay module 240 may further include a charging lamp (not illustrated) which may be turned on to notifying the outside of whether the battery is fully charged based on a battery voltage detected by the power detection unit.

Figure 11:
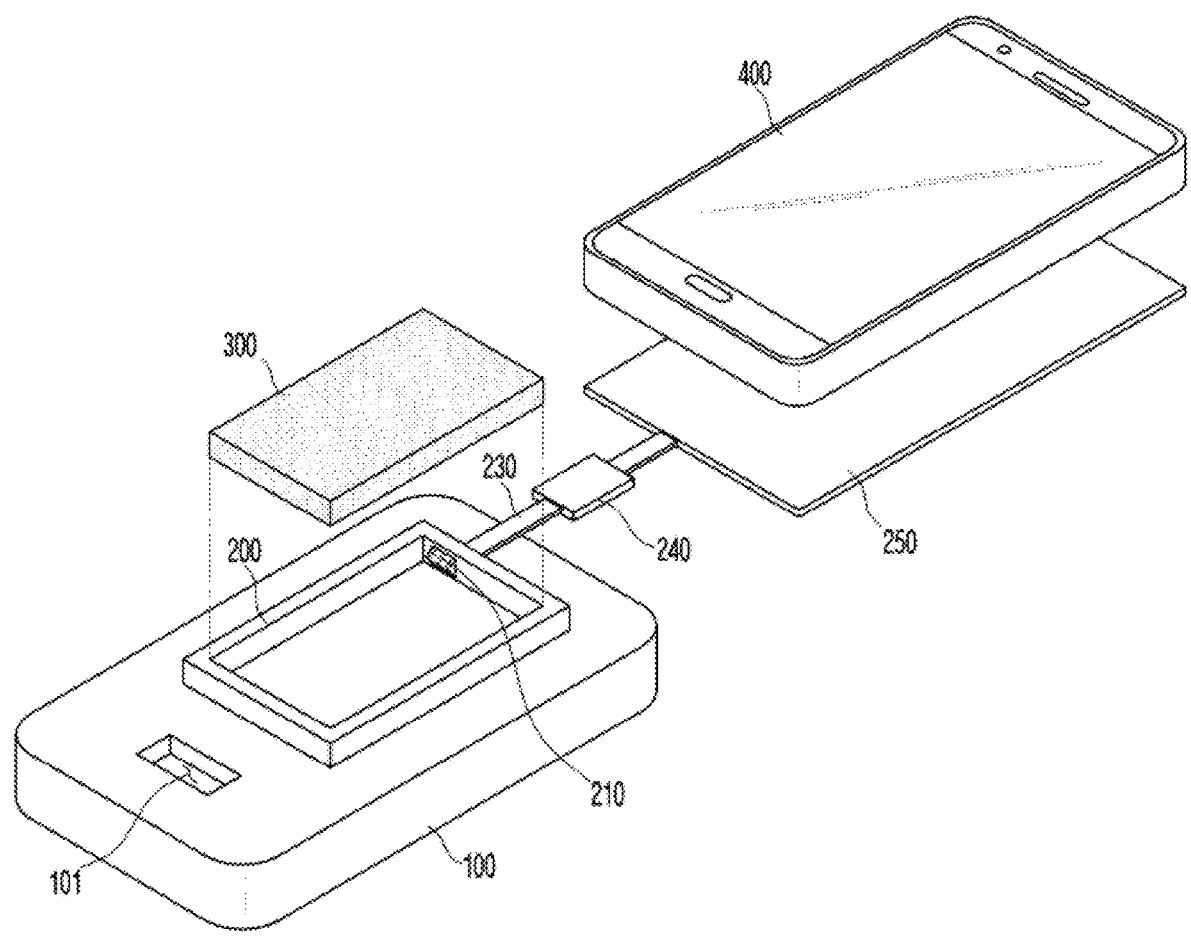
Figure 12:
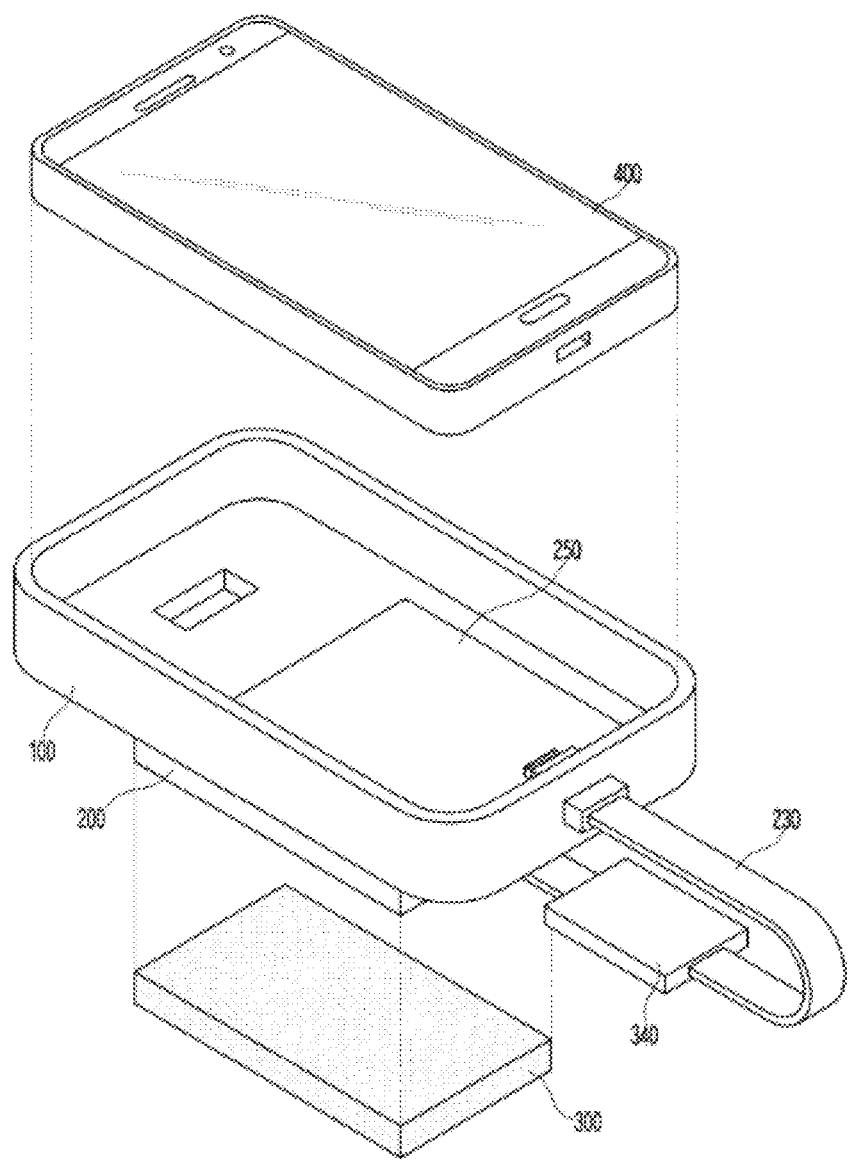
FIG. 12 is a view illustrating a state in which a wireless charging module is connected, through the connecting cable, to the auxiliary battery case according to the exemplary embodiment of the present disclosure.
Figure 13:
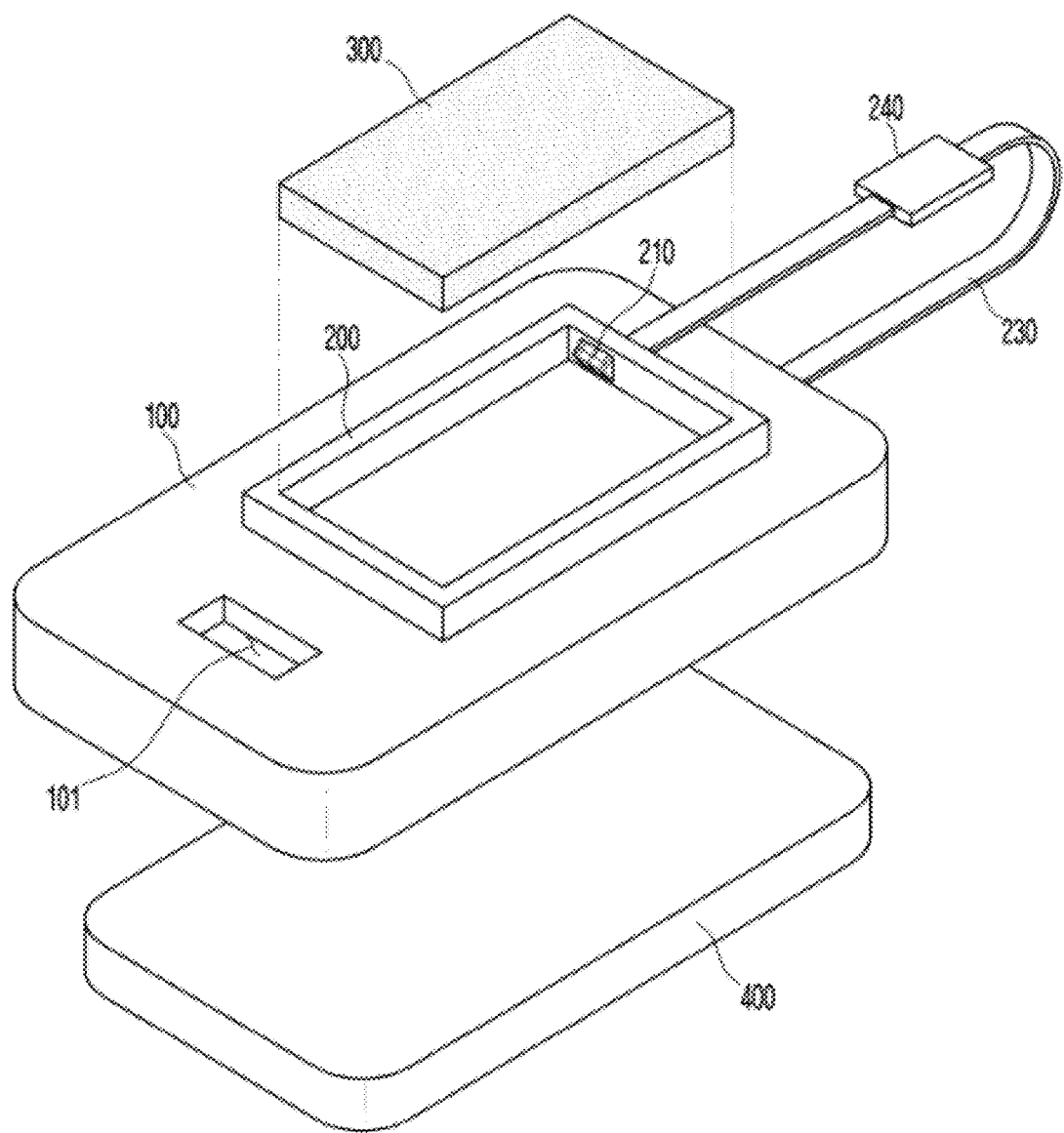
FIG. 13 is a view illustrating a state in which the wireless charging module illustrated in FIG. 12 is mounted on the mobile terminal case.

Meanwhile, FIGS. 11 and 12 are views illustrating a state in which a wireless charging module is connected, through the connecting cable, to the auxiliary battery case according to the exemplary embodiment of the present disclosure, and FIG. 13 is a view illustrating a state in which the wireless charging module illustrated in FIG. 12 is mounted in the mobile terminal case.

As illustrated in FIGS. 12 and 13, the mobile terminal side contact terminal 220 of the protective case for a mobile terminal according to the exemplary embodiment of the present disclosure may be electrically connected to a wireless charging module 250.

Here, the wireless charging module 250 serves to transmit electric power in a wireless manner to the battery mounted in the mobile terminal 100 by a wireless electric power transmission method such as magnetic induction or magnetic resonance, and may be, but not particularly limited to, a publicly known wireless charging module. However, a shape of the wireless charging module 250 corresponds to a shape of the mobile terminal case 100 and the wireless charging module 250 has a small thickness so that the wireless charging module 250 may be accommodated in the mobile terminal case 100, such that there occurs no interference when the mobile terminal 400 is mounted in the mobile terminal case 100.

In addition, a shielding material made of a magnetic material and the like may be provided on an inner bottom surface of the mobile terminal case 100 and/or an inner bottom surface of the auxiliary battery case 200 in order to prevent wireless electric power from being transmitted from the wireless charging module 250 to the auxiliary battery 300.

The wireless charging module 250 is also formed integrally with the connecting cable 230, but the wireless charging module 250 may be provided with a third connecting cable side contact terminal so that the wireless charging module 250 may be attached to or detached from the mobile terminal side connector of the connecting cable 230.

Meanwhile, a size of the auxiliary battery may vary depending on a model of the mobile terminal or a capacity of the battery. Therefore, the size of the auxiliary battery case 200 may be variable, and various means may be adopted to vary the size of the auxiliary battery case 200, but the following means may be adopted to the protective case for a mobile terminal according to the exemplary embodiment of the present disclosure.

Figure 3A:
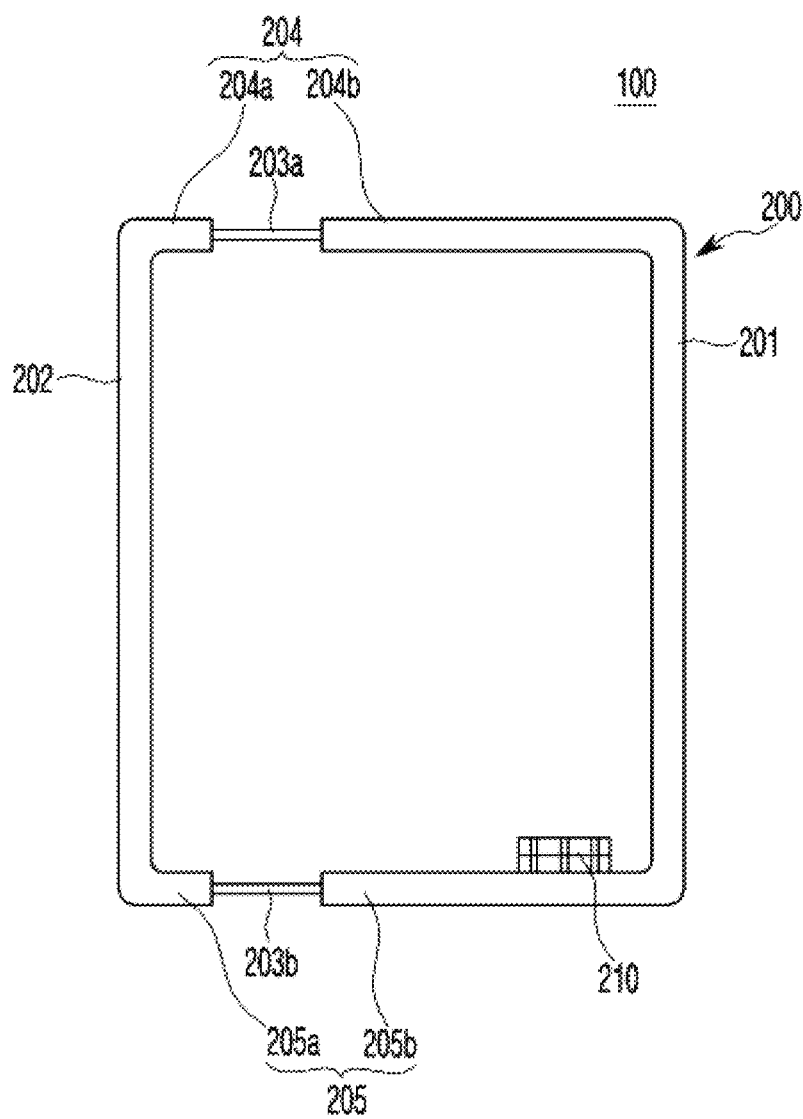
FIGS. 3A to 3C illustrate another exemplary embodiment of an auxiliary battery case positioned on a rear surface of the protective case for a mobile terminal illustrated in FIG. 2.
Figure 3B:
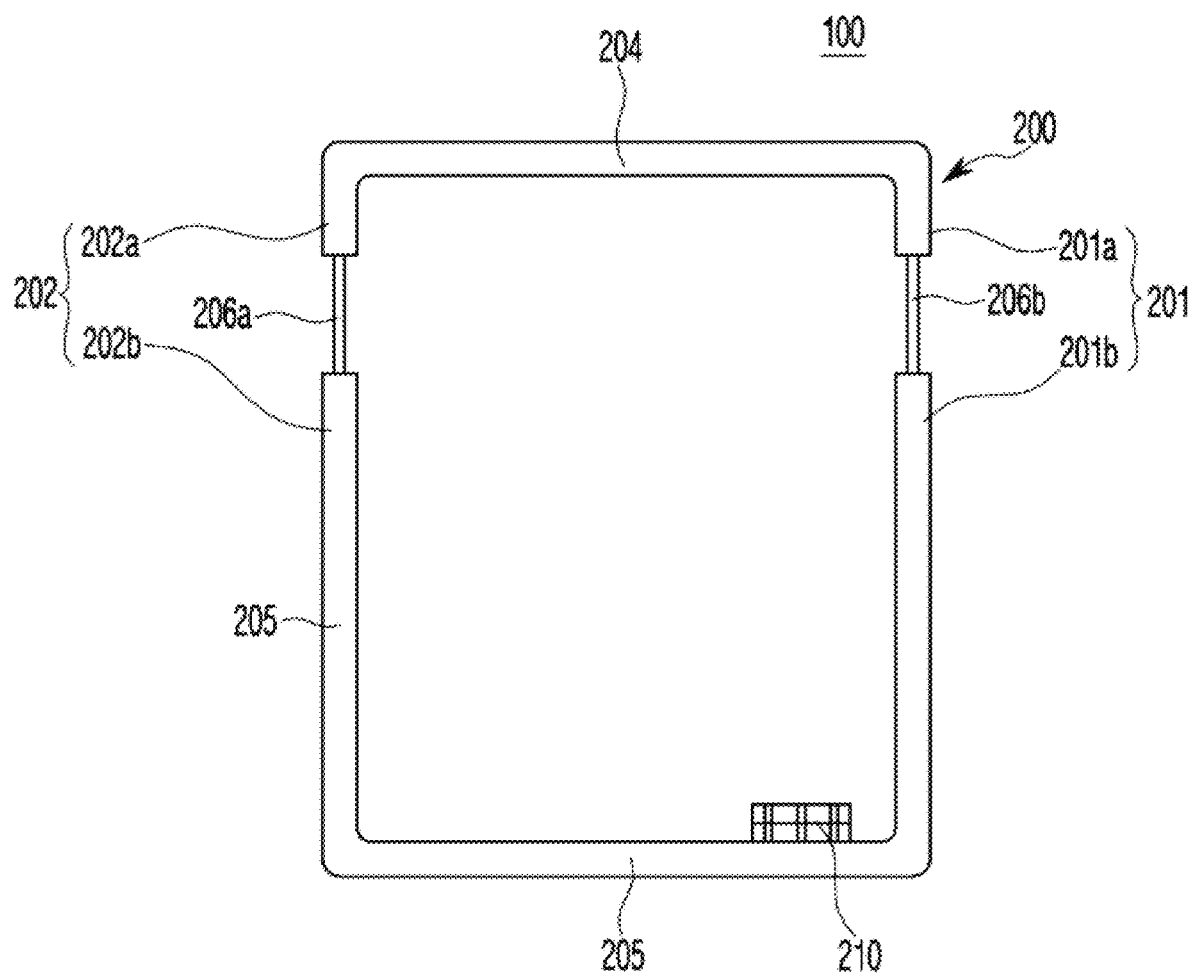
Figure 3C:
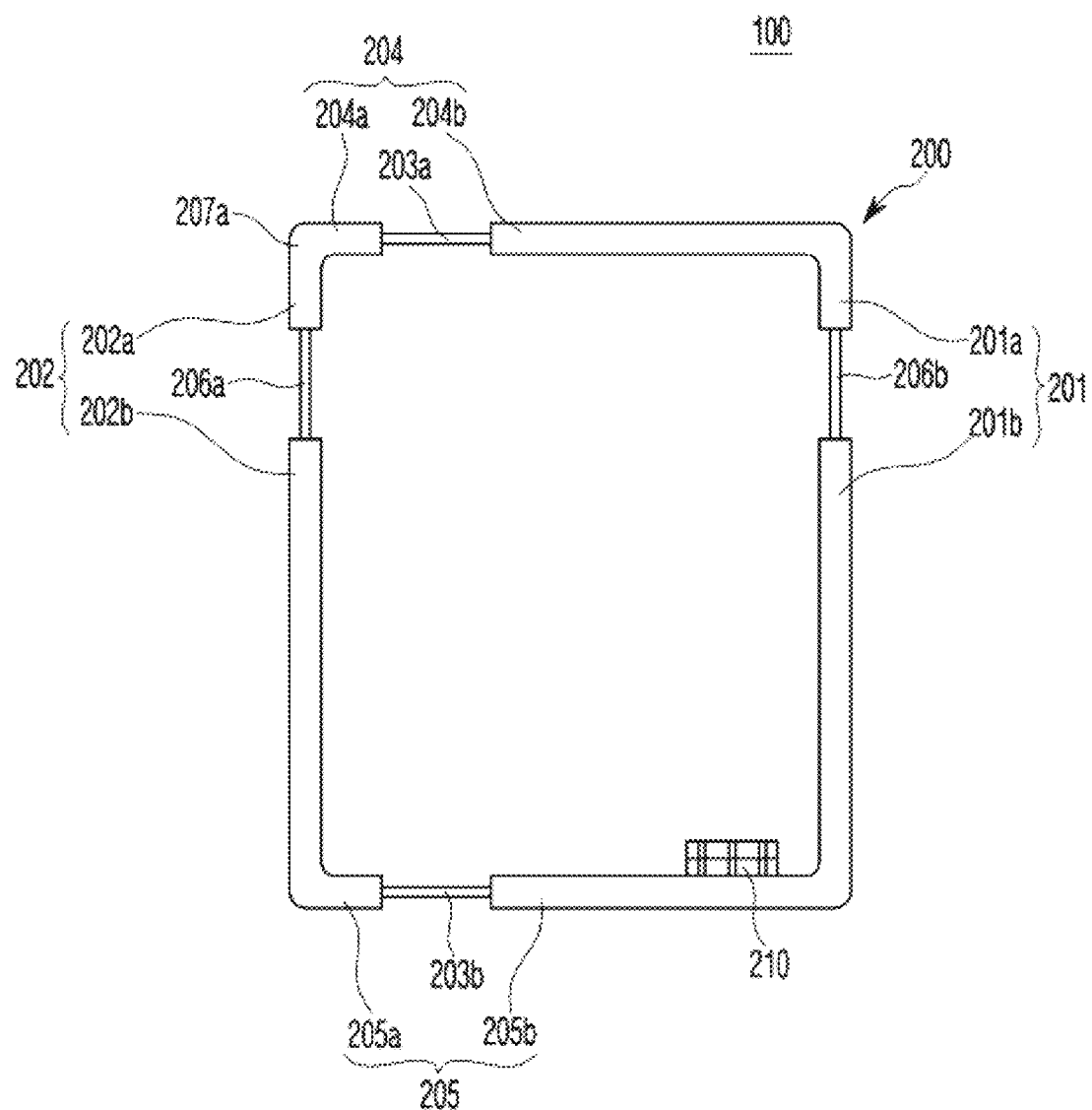
Figure 4:
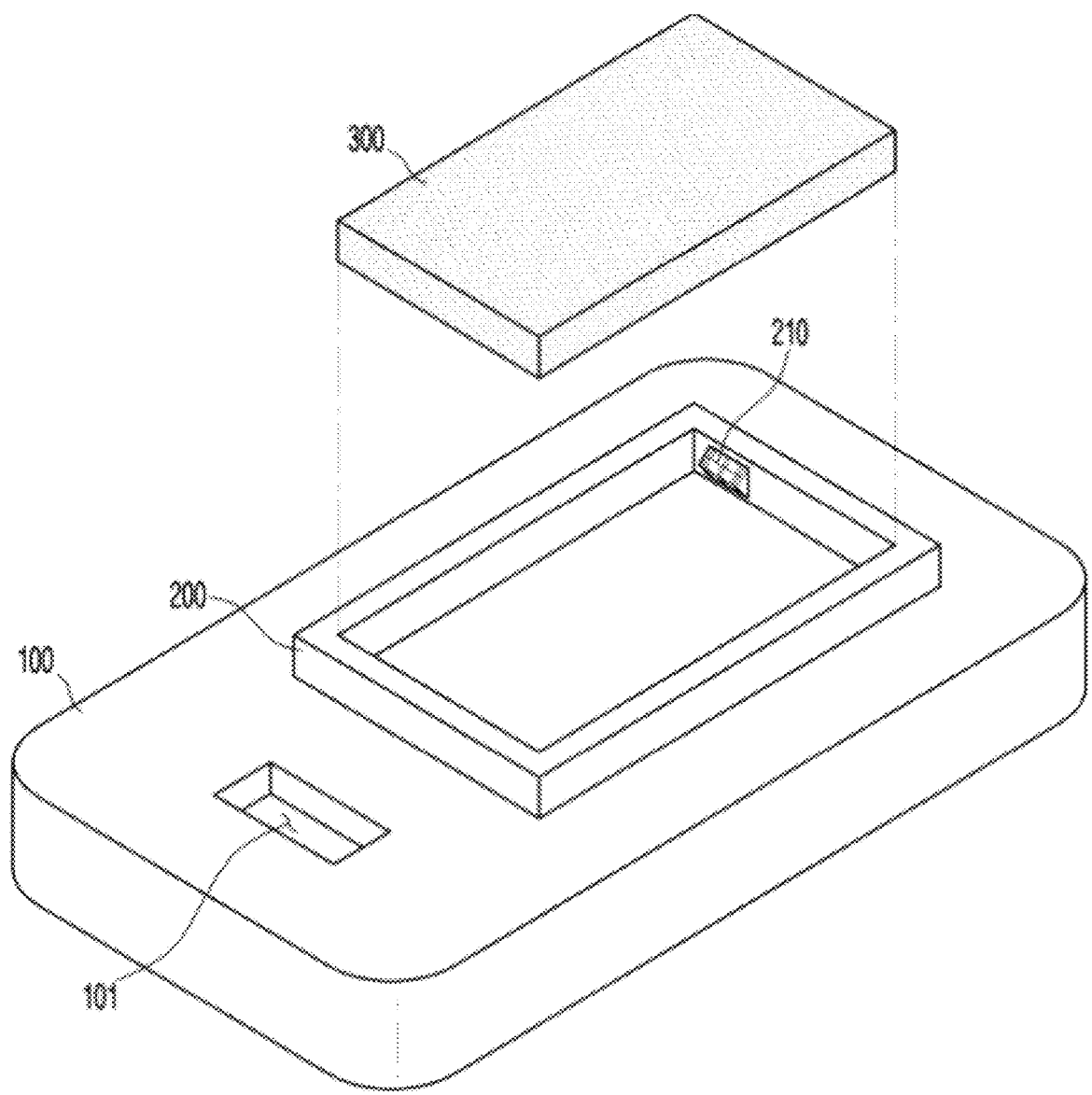
FIG. 4 is a view illustrating a state in which an auxiliary battery is mounted in the auxiliary battery case positioned on the rear surface of the protective case for a mobile terminal illustrated in FIG. 2.

FIGS. 3A to 3C illustrate another exemplary embodiment of the auxiliary battery case positioned on the rear surface of the protective case for a mobile terminal illustrated in FIG. 2.

As illustrated in FIGS. 3A to 3C, the protective case for a mobile terminal according to the exemplary embodiment of the present disclosure may include an upper frame 204, a lower frame 205, a left frame 202, and a right frame 201, such that the protective case for a mobile terminal may have a roughly quadrangular frame shape.

At least one pair of the pair of upper and lower frames 204 and 205 and the pair of left and right frames 201 and 202 is divided into a plurality of partial frames, and the divided partial frames are slid along at least one longitudinally extending guide, and as a result, a size of the accommodation space of the auxiliary battery case 200 may vary.

In this case, the auxiliary battery side contact terminal 210 may be disposed on an inner surface of one end portion of the lower frame 205, and bottom surfaces of the frames (rear surfaces of the frames and the mobile terminal case 100) at the periphery of the portion where the auxiliary battery side contact terminal 210 is positioned are attached to the mobile terminal case 100 so that positions thereof are fixed, and as a result, it is possible to prevent the auxiliary battery case 200 from being withdrawn from the protective case.

Specifically, as illustrated in FIG. 3A, the size of the accommodation space of the auxiliary battery case 200 may vary as the left frame 202 slides in a left and right direction along first longitudinally extending guides 203a and 203b formed at the other end portion of the lower frame 205 (an end portion at which the auxiliary battery side contact terminal 210 is not positioned) and the other end portion of the upper frame 204 that corresponds to the other end portion of the lower frame 205. That is, the first longitudinally extending guides 203a and 203b are installed in a longitudinal direction between a first partial upper frame 204a and a second partial upper frame 204b that constitute the upper frame 204, and between a first partial lower frame 205a and a second partial lower frame 205b that constitute the lower frame 205, such that the left frame 202 may be moved in the left and right direction along the first longitudinally extending guides 203a and 203b.

In this case, the first longitudinally extending guides 203a and 203b may be configured to have elastic force in a direction in which an interval between the left frame 202 and the right frame 201 is decreased, such that the left and right frames 201 and 202 are in close contact with the auxiliary battery 300, but the present disclosure is not necessarily limited thereto.

As another exemplary embodiment, as illustrated in FIG. 3B, the size of the accommodation space of the auxiliary battery case 200 may vary as the upper frame 204 slides in an up and down direction along second longitudinally extending guides 206a and 206b formed at a first cut-out portion formed at one position of the left frame 202 and a second cut-out portion formed at one position of the right frame 201. That is, the second longitudinally extending guides 206a and 206b are installed in a longitudinal direction between a first partial left frame 202a and a second partial left frame 202b that constitute the left frame 202, and between a first partial right frame 201a and a second partial right frame 201b that constitute the right frame 201, such that the upper frame 204 may be moved in the up and down direction along the second longitudinally extending guides 206a and 206b. Here, a position of the second cut-out portion faces a position of the first cut-out portion, but the present disclosure is not necessarily limited thereto.

In this case, similar to the first longitudinally extending guides 203a and 203b, the second longitudinally extending guides 206a and 206b may also be configured to have elastic force in a direction in which an interval between the upper frame 204 and the lower frame 205 is decreased, such that the upper and lower frames 204 and 205 are in close contact with the auxiliary battery 300, but the present disclosure is not necessarily limited thereto.

As still another exemplary embodiment, as illustrated in FIG. 3C, the frame may be configured to have a combination of the exemplary embodiments illustrated in FIGS. 3A and 3B. Specifically, the upper frame 204 is divided into the first partial upper frame 204a and the second partial upper frame 204b, and the lower frame 205 is divided into the first partial lower frame 205a and the second partial lower frame 205b, such that the divided partial frames may be coupled to be slidable in the left and right direction by the first longitudinally extending guides 203a and 203b. In addition, the left frame 202 is divided into the first partial left frame 202a and the second partial left frame 202b, and the right frame 201 is divided into the first partial right frame 201a and the second partial right frame 201b, such that the divided partial frames may be coupled to be slidable in the up and down direction by the second longitudinally extending guides 206a and 206b.

Meanwhile, the auxiliary battery case 200 according to the exemplary embodiment of the present disclosure may be positioned to be biased in a direction toward one end portion of the rear surface of the mobile terminal case 100.

The auxiliary battery case 200 is formed to protrude from the rear surface of the mobile terminal case 100 by the frames 201 to 204, such that when the mobile terminal case 100 in which the mobile terminal 400 is mounted is tilted at a predetermined angle with respect to the ground surface, the protruding frames 201 to 204 support the mobile terminal case 100, such that a screen of the mobile terminal 400 is directed toward the user's line of sight, and as a result, it is possible to improve convenience for the user using the mobile terminal 400.

Meanwhile, the auxiliary battery case 200 according to the exemplary embodiment of the present disclosure further includes a cover (not illustrated) for covering a space for accommodating the auxiliary battery 300. The cover may be hingedly coupled to one side of the auxiliary battery case, such that the cover, which is opened at a predetermined angle, may mount the mobile terminal 400 tilted at a predetermined angle with respect to the ground surface.

As another exemplary embodiment, the cover may be provided as an accessory separated from the auxiliary battery case, and in this case, the cover may include at least one hook formed on a surface facing the auxiliary battery case 200, and the auxiliary battery case 200 and/or the mobile terminal case 100 may have a hook fastener (not illustrated) formed at a position corresponding to the hook. Therefore, as the hook and the hook fastener are fastened to each other, the cover may cover and protect the auxiliary battery in the battery accommodation space of the auxiliary battery case 200.

As still another exemplary embodiment, if the cover includes at least one hook, the auxiliary battery case 200 and/or the mobile terminal case 100 may have a guide groove portion (not illustrated) which is formed at a position corresponding to the hook and may guide a sliding movement of the hook. Therefore, as the hook slides along the guide groove portion, the cover may cover and protect the auxiliary battery in the battery accommodation space of the auxiliary battery case 200.

The exemplary embodiments of the present disclosure have been described with reference to the drawings. It will be appreciated that the exemplary embodiments of the present disclosure have been described above for purposes of illustration, and those skilled in the art may easily modify the present disclosure in other specific forms without changing the technical spirit or the essential features of the present disclosure.

Accordingly, the scope of the present disclosure is represented by the claims to be described below rather than the detailed description, and it should be interpreted that the meaning and scope of the claims and all the changes or modified forms derived from the equivalent concepts thereto fall within the scope of the present disclosure.

What is claimed is:

1. A protective case for a mobile terminal, the protective case comprising:
    a mobile terminal case which has a box shape configured to surround and protect the mobile terminal, a mobile terminal side contact terminal provided in the mobile terminal case and configured to be contacted with the mobile terminal;
    an auxiliary battery case having an open-end body, comprising a plurality of sidewalls formed above a rear surface of the mobile terminal case to encase an auxiliary battery, and comprising auxiliary battery side contact terminal disposed on one of the sidewalls; and
    a connection cable supplying electric power of the auxiliary battery to the mobile terminal by detachably connecting the mobile terminal side contact terminal and the auxiliary battery side contact terminal,
    wherein the connecting cable comprises:
    a power relay module configured to regulate the electric power supply from the auxiliary battery such that electrical power with a preset value is supplied from the auxiliary battery on the mobile terminal,
    wherein the auxiliary battery in the sidewalls is exposed to the outside when the auxiliary battery supplies electrical power to the mobile terminal; and
    wherein the sidewalls are affixed to the rear surface of the mobile terminal case such that the mobile terminal remains in place as a user inserts or removes the auxiliary battery from the auxiliary case.

2. The protective case of claim 1, wherein the auxiliary battery side contact terminal is at least one conductive pin which protrudes to come into direct contact with a terminal exposed outside of the auxiliary battery.

3. The protective case of claim 1, wherein the mobile terminal case further includes a first connecting cable side contact terminal which is positioned on an outer surface of the mobile terminal case and comes into electrical contact with a mobile terminal side connector positioned at one tip portion of the connecting cable.

4. The protective case of claim 1, wherein the auxiliary battery case further includes a second connecting cable side contact terminal which is positioned on an outer surface of the auxiliary battery case and comes into electrical contact with an auxiliary battery side connector positioned at the other tip portion of the connecting cable.

5. The protective case of claim 1, wherein the power relay module includes:
    a power detection unit which detects voltage of the mobile terminal; and
    a charging control unit which cuts off a supply of electric power from the auxiliary battery to the mobile terminal when a battery in the mobile terminal is fully charged based on the voltage detected by the power detection unit.

6. The protective case of claim 5, wherein the charging control unit cuts off a supply of electric power from the auxiliary battery to the mobile terminal based on a result of comparing a predetermined charging reference value and a voltage value detected by the power detection unit, and the power relay module performs data communication with the mobile terminal, such that the charging reference value is set or changed by an application executed in the mobile terminal.

7. The protective case of claim 1, wherein the auxiliary battery case includes an upper frame, a lower frame, a left frame, and a right frame, the auxiliary battery side contact terminal is disposed on an inner surface of one end portion of the lower frame such that a position of one end portion of the lower frame is fixed, and a size of an accommodation space of the auxiliary battery case varies as the left frame slides in a left and right direction along first longitudinally extending guides formed at the other end portion of the lower frame and the other end portion of the upper frame corresponding to a position of the other end portion of the lower frame.

8. The protective case of claim 1, wherein the auxiliary battery case includes an upper frame, a lower frame, a left frame, and a right frame, the auxiliary battery side contact terminal is disposed on an inner surface of one end portion of the lower frame such that a position of one end portion of the lower frame is fixed, and a size of the accommodation space of the auxiliary battery case varies as the upper frame slides in an up and down direction along second longitudinally extending guides formed at a first cut-out portion formed at one position of the left frame and a second cut-out portion formed at one position of the right frame.

9. The protective case of claim 1, wherein the auxiliary battery case is positioned to be biased in a direction toward one end portion of the mobile terminal case and protrudes outward from the rear surface of the mobile terminal case.

10. The protective case of claim 1, wherein the auxiliary battery case includes a cover for covering a space for accommodating the auxiliary battery, and the cover is hingedly coupled to one side of the auxiliary battery case, such that the cover, which is opened at a predetermined angle, mounts the tilted mobile terminal.

11. The protective case of claim 1, wherein the auxiliary battery case includes a cover for covering a space for accommodating the auxiliary battery, and the cover is provided as an accessory separated from the auxiliary battery case and includes at least one hook protruding from a surface of the cover that faces the auxiliary battery case, such that the cover is coupled to the auxiliary battery case.

* * * * *